United States Patent [19]
Rush

[11] Patent Number: 5,934,991
[45] Date of Patent: Aug. 10, 1999

[54] POD LOADER INTERFACE IMPROVED CLEAN AIR SYSTEM

[75] Inventor: John M. Rush, Mountain View, Calif.

[73] Assignee: Fortrend Engineering Corporation, Suunyvale, Calif.

[21] Appl. No.: 09/021,494

[22] Filed: Feb. 1, 1998

[51] Int. Cl.[6] ........................................... B01L 1/04
[52] U.S. Cl. .......................... 454/187; 414/416; 414/811
[58] Field of Search ............................ 454/187; 414/416, 414/811

[56] References Cited

U.S. PATENT DOCUMENTS

| | | | |
|---|---|---|---|
| 4,904,153 | 2/1990 | Iwasawa et al. | 414/735 |
| 4,927,438 | 5/1990 | Mears et al. | 55/385.2 |
| 4,963,069 | 10/1990 | Wurst et al. | 414/416 |
| 5,241,758 | 9/1993 | Cruz et al. | 34/22 |
| 5,362,274 | 11/1994 | Seiichiro | 454/66 |

*Primary Examiner*—Harold Joyce
*Assistant Examiner*—Derek S. Boles
*Attorney, Agent, or Firm*—Donald E. Schreiber

[57] ABSTRACT

A fan is attached directly adjacent to a clean air filter sealing an air inlet under a horizontal portion of a plenum chamber below a vertically movable loading platform which all move as a unit. A vertical portion of the plenum chamber, trapezoidal in cross-section, communicates with a wafer pod on the loading platform through an angled perforated grill sealing an air outlet from the vertical portion of the plenum chamber. Clean air flows evenly throughout the entire height of an angled perforated grill over the surfaces of the wafers. Mechanisms lift the pod cover and load and unload the wafer carrier.

12 Claims, 4 Drawing Sheets

POD LOADER INTERFACE IMPROVED CLEAN AIR SYSTEM

BACKGROUND OF THE INVENTION

1. Field of the Invention

The present invention relates generally to silicon wafer handling machines, and more particularly to an improved clean air system for a pod loader interface ("PLI") system particularly adapted to unload and reload Standard Mechanical InterFace ("SMIF") pods.

2. Description of the Prior Art

Handling of silicon wafers is critical to the IC manufacturing process. Any physical damage to the wafers will decrease the chip yield, which is a prime factor for the profitability of the semiconductor device manufacturing. Contamination of the wafer by particulates or other contaminants decreases chip yield.

The desire to shield the wafers from contaminants has led to the development and use of SMIF pods in the semiconductor processing industry. The SMIF pods allow wafers to be transported in a sealed environment, so that they are not exposed to ambient air.

After an SMIF pod reaches a wafer processing apparatus, they must be opened, and the wafer carrier inside must be placed in position for the desired process operation. If the unloading and positioning operation is performed manually the wafers are subjected to an increased risk of damage from mishandling as well as increased exposure to contamination.

Other prior art attempts to maintain a clean air environment relative to semiconductor wafer transfer and processing operations fail to achieve the advantages of the present invention.

U.S. Pat. No. 5,241,758 issued Sep. 7, 1993, to Cruz et al. ("Cruz patent") applies clean air via a solid plate with a central hole through which the clean air passes over a single disc-shaped surface of semiconductor wafers placed directly below the plate. The device of the Cruz patent is used in operations on the wafers one-at-a-time and could not be used on a pod of stacked wafers used in transferring wafers, such as the SMIF pod.

U.S. Pat. No. 5,362,274 issued Nov. 8, 1994, to Seiichiro ("Seiichiro patent") blows clean air through an arched conduit having multiple horizontal slits over wafers in an apparatus for washing semiconductor materials. The conduit device of the Seiichiro patent is relatively complex and expensive to construct and takes up a substantial amount of space due to the arched conduit. A prior art device shown in FIGS. 7 and 8 of the Seiichiro patent employs a vertical screen perforated with widely spaced holes for directing a flow of clean air horizontally across semiconductor wafers. The Seiichiro patent reports that this prior art device exhibits in an undesirable turbulent air flow.

U.S. Pat. No. 4,927,438 issued May 22, 1990, to Mears et al. ("Mears patent") provides horizontal clean air flow over wafers in a load chamber of a load lock by pumping air up from a vertical duct through a vertical filter adjacent to the wafers and also downward clean air flow through a horizontal air filter above the wafers, all in a closed air circulation within the load chamber. The Mears patent lacks any description of air flow uniformity either vertically across the vertical filter, or horizontally across the horizontal filter.

U.S. Pat. No. 4,963,069 issued Oct. 16, 1990, to Wurst et al. ("Wurst patent") describes a wafer carrier having a fan and filter on top of the carrier with clean air blowing downwardly onto the wafers which are oriented vertically with the bottom of the container open. Wurst also indicates that the fan and filter may be positioned on the side of the carrier with the clean air blowing horizontally over the wafers with the other side of the container open. A secondary clean air flow in the process apparatus in a direction parallel to that of the air flow in the container and a third clean air flow in a transfer device is transverse to the air flow in the container. The container with fan and filter is more costly and complex than a sealed SMIF pod, and should the container fan fail contaminants could enter the wafer carrier.

U.S. Pat. No. 4,904,153 issued Feb. 27, 1990, to Iwasawa et al. ("Iwasawa patent") provides a transporting robot for semiconductor wafers in which the wafers are stacked vertically in holders which are moved by robot arms while overhead fans blow downwardly through horizontal filters toward the wafers below. In the Iwasawa device the filter is separated by a substantial distance from the wafers so that the air velocity at the wafers would be reduced and would likely be turbulent rather than laminar air flow and there would not likely be an even flow over all of the wafers.

Fortrend Engineering Corporation has developed a PLI system which automatically unloads a SMIF pod and positions the wafer carrier and the wafers contained therein so as to be ready for the next process operation, and then reloads the wafer carrier and the wafers carried therein into the SMIF pod after the process step is completed. That PLI system, as described in U.S. patent application Ser. No. 08/400,039 filed Mar. 7, 1995, that is hereby incorporated by reference, includes an elevator that raises the SMIF cover away from its base to reveal the wafer carrier contained in the SMIF pod. An articulated arm thereafter reaches through an opening in a bulkhead of the machine, securing the wafer cassette and withdrawing it through the hole in the bulkhead. The wafer cassette is then placed in position to be operated upon by the next step in the manufacturing process. A loading platform that supports the wafer carrier moves up and down when activated by an electric motor to adjust the height of the wafer carrier for proper unloading to and reloading from the various devices that operate on the wafers.

The PLI system maintains the wafer carrier carrying the semiconductor wafers in an ultra-clean micro-environment by supplying ultra-clean air that flows horizontally across planar, disk-shaped surfaces of the semiconductor wafers present in the wafer carrier. To provide the flow of air, the prior art PLI system includes a horizontal portion of a plenum chamber that is located beneath the vertically movable loading platform supporting the wafer carrier. The horizontal portion of the plenum chamber communicates with a vertical portion of the plenum chamber that is displaced to one side of the loading platform and extends upward a distance that slightly exceeds the height of the SMIF pod. In this PLI system, air flowing out of the vertical portion of the plenum chamber passes in a straight line directly across the semiconductor wafers present in the wafer carrier located on the loading platform to exit the micro-environment through the opening in the PLI system's bulkhead. This direct flow of air across the semiconductor wafers and through the bulkhead opening differs from wafer handling systems that lack a direct air flow path across the wafers. A consideration for achieving in this PLI system a direct air-flow path that passes through a wafer carrier and across the wafers is that reducing floor area occupied by the PLI system correspondingly constrains horizontal depth directed away from the bulkhead opening that may be allotted to the vertical portion of the plenum chamber.

An ULPA filter, that is located directly below the loading platform which receives the SMIF pod, covers an inlet opening in a floor of the bottom portion of the plenum chamber. Ultra-clean air enters the plenum chamber through the inlet opening after passing through the ULPA filter.

In an attempt to establish a uniform horizontal velocity for air flowing across all the wafers throughout the height of the wafer carrier, the prior art PLI system includes a vertically oriented membrane which covers the aperture through which air leaves the vertical plenum chamber to flow horizontally across the wafers. The membrane, which is formed from two layers of GORTEX® fabric, seals that aperture and separates the vertical portion of the plenum chamber from the area on the loading platform which receives the SMIF pod. In this PLI system, the use of the GORTEX fabric membrane yields a velocity for air flowing across the wafers that varies vertically along the height of the SMIF pod's wafer carrier, and that ranges between 20 and 70 feet/minute. Within the semiconductor processing industry, an accepted standard for air flow is that it must have a uniform velocity both in a specified direction across the wafers, and that the velocity be approximately 90 feet/minute. Accordingly, to more effectively purge contaminants from the PLI system's micro-environment, it is desirable that the air flow across the wafers be increased above that attainable with the two layers of GORTEX fabric, and that air flow uniformity be increased throughout the height of the SMIF pod's wafer carrier.

Because the loading platform which receives the SMIF pod moves up and down, the prior art PLI system includes a flexible bellows that extends downward from below the ULPA filter to a base of the PLI system where the bellows is coupled to a stationary fan. The flexible bellows permits the loading platform to move vertically up and down while communicating a flow of clean air from the fan to the ULPA filter. The flexible bellows appears to be a significant source of contaminants in air flowing across the semiconductor wafers within the wafer carrier.

SUMMARY OF THE INVENTION

The present invention represents improvements in the Fortrend PLI system which maintains the advantages of that device while simultaneously eliminating contamination caused by the flexible bellows, and providing a faster, more uniform velocity for ultra clean air flowing across wafers beyond that achievable with the GORTEX fabric membrane.

Accordingly, one object of the present invention is to increase the velocity of the clean air flow across the wafers and to improve the uniformity of that air flow.

A related object of the present invention is to provide a uniform, higher velocity air flow throughout the height of the wafer carrier.

Another object of the present invention is to provide a system for automatically opening and unloading, and later reloading, a SMIF pod that has a uniform, higher velocity, cleaner air flow through a wafer carrier located on the system's loading platform and across semiconductor wafers carried therein.

One more object of the present invention is to reduce contamination of the clean air flow in the PLI system by eliminating the flexible bellows which appears to be a significant source of contaminants in air flowing across the semiconductor wafers within the wafer carrier.

In brief, an improved clean air system for the Fortrend PLI system described above incorporates two distinguishing differences. First, the improved integrated air flow system for the PLI system includes a plenum chamber connected to and communicating with the loading platform. The plenum chamber includes an inlet opening for receiving a flow of clean air. The plenum chamber also includes a vertical portion that has a vertical length that is slightly greater than a height of the wafer carrier, and that is positioned adjacent to a wafer carrier when it is present on the loading platform. The vertical portion of the plenum chamber includes an outlet opening for directing a flow of clean air past a wafer carrier located on the loading platform. The improved integrated air flow system replaces the GORTEX membrane with compound grills that are located within the plenum chamber. A first of the compound grills is oriented at an angle so the vertical portion of the plenum chamber on a side of that grill nearest to the inlet opening tapers from a wider cross-section nearest to the inlet opening to a narrower cross-section furthest from the inlet opening. A second of the compound grills is located between the first grill and the PLI system's bulkhead opening, and is oriented vertically thereby establishing an area within the plenum chamber between the first and second grills that has a vertically-oriented, triangular cross-sectional shape. Positioning the grills in this way establishes vertically-oriented triangular cross-sections both for the plenum chamber on the side of the grill nearest to the inlet opening and between the grills. Disposed in this location, the grills occlude the plenum chamber while concurrently permitting the stream of clean air to pass out of the outlet opening in a high-velocity, uniform horizontal flow and through a wafer carrier located on the loading platform.

Another distinction between the present invention and the prior art is elimination of the extensible bellows and securing the fan directly to the ULPA clean air filter that covers the inlet opening of the plenum chamber. Because in the preferred embodiment the inlet opening of the plenum chamber is located in the floor of a horizontal portion of the plenum chamber below the loading platform, both the clean air filter and the fan move with the loading platform as it travels up and down during operation of the PLI system.

An advantage of the present invention is that it provides a cleaner micro-environment than the prior art.

Another advantage of the present invention is that it produces a higher velocity uniform clean air flow over the entire height of the wafer carrier.

These and other features, objects and advantages will be understood or apparent to those of ordinary skill in the art from the following detailed description of the preferred embodiment as illustrated in the various drawing figures.

DETAILED DESCRIPTION OF THE PREFERRED EMBODIMENTS

Figure 1:
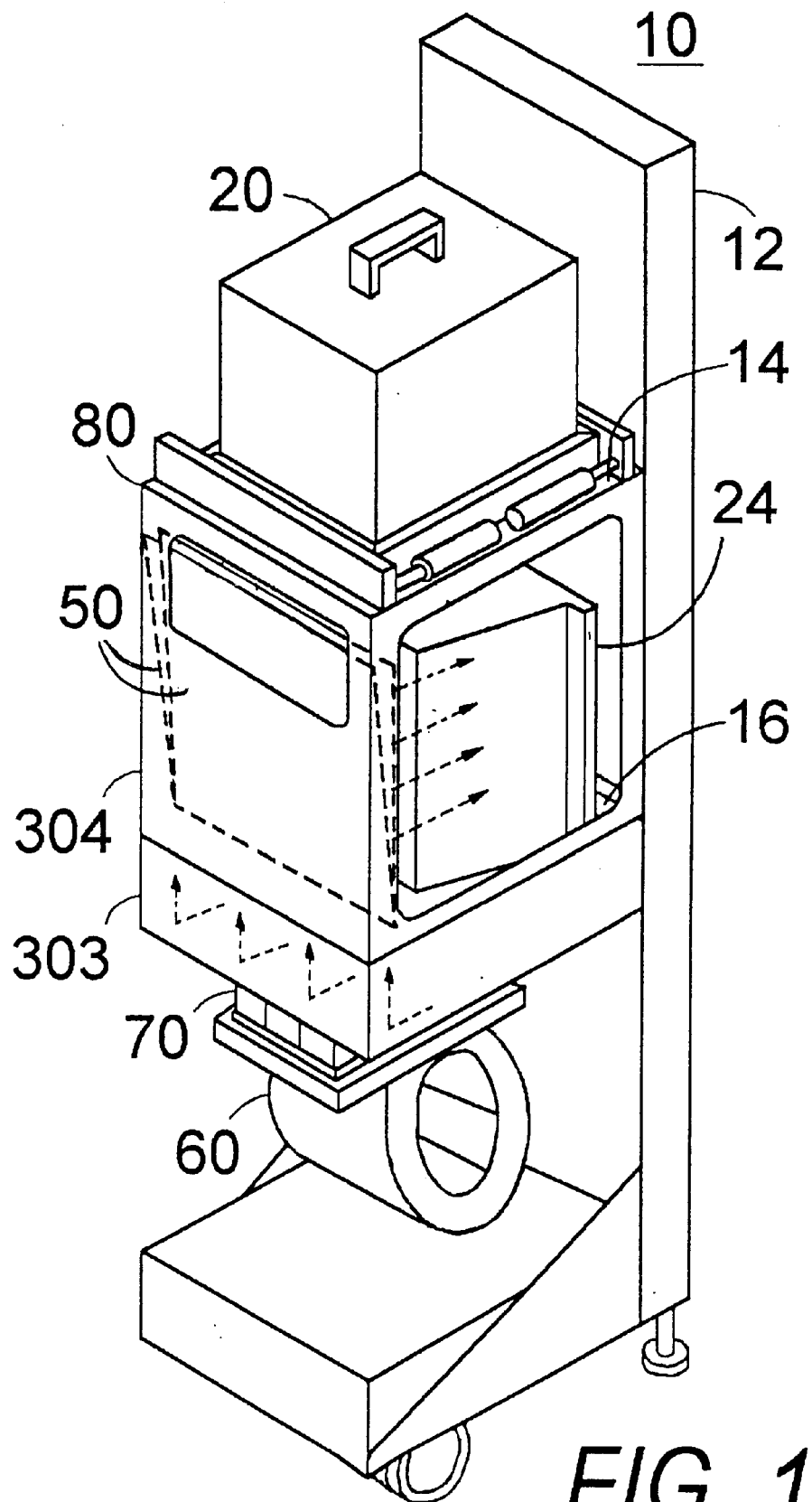
FIG. 1 is a front perspective view of the improved pod loader interface of the present invention showing the fan mounted directly beneath the filter that is secured to the horizontal portion of the plenum chamber below the loading platform, and also showing the perforated grills that establishes the triangular cross-sectional shapes in the vertical portion of the plenum chamber.

FIGS. 1 and 3–5 depict a pod loader interface 10 adapted for unloading and reloading a SMIF pod. As depicted in FIG. 1, the SMIF pod includes a wafer carrier 24, adapted to receive and support a plurality of wafers in a spaced parallel arrangement. FIG. 1 also depicts a pod cover 20 which mates with and seals to a base of the SMIF pod thereby enclosing within the sealed SMIF pod both the wafer carrier 24 and any wafers received therein.

Figure 5:
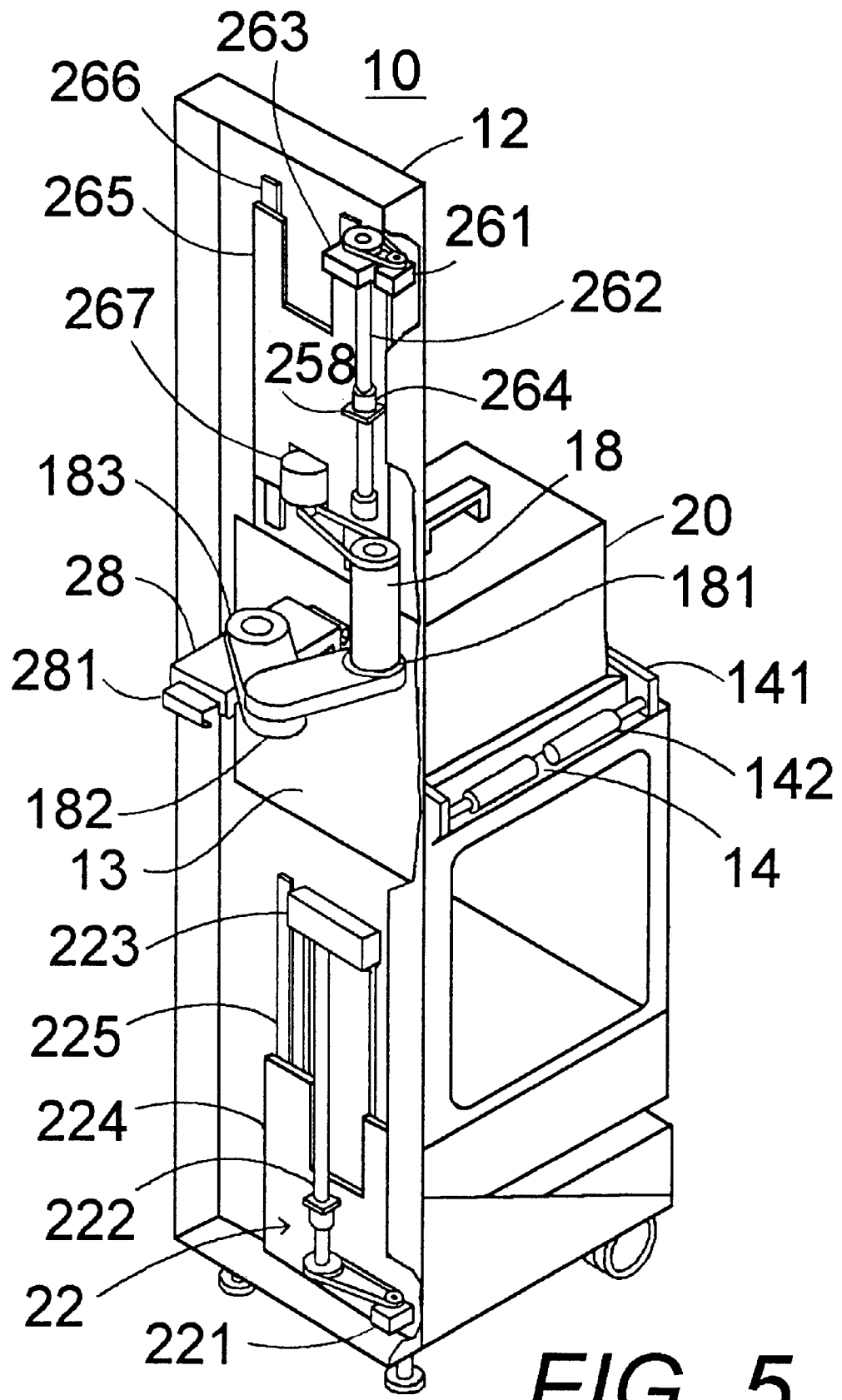
FIG. 5 is a rear perspective view of the improved pod loader interface showing the mechanisms for lifting the cover, moving the loading platform, and loading the pod.

The pod loader interface 10 includes a main bulkhead 12, having an opening 13 formed therethrough best illustrated in FIG. 5, that supports a loading platform 16. The loading platform 16 is adapted for receiving the base of the SMIF pod, and for moving vertically. An elevator 14, movably supported on the main bulkhead, raises the pod cover 20 to expose the wafer carrier 24 of the SMIF pod. An articulated arm 18, supported on the back of the main bulkhead (FIG. 5), picks up the exposed wafer carrier 24 and transports it horizontally through the opening 13 in the main bulkhead 12. After the wafer carrier 24 passes through the opening 13, the articulated arm 18 ultimately deposits the wafer carrier 24 at a pre-established location on a wafer processing apparatus that is not depicted in any of the FIGs.

While the pod cover 20 is raised above the base of the SMIF pod and the wafer carrier 24 is exposed upon the loading platform 16, an air flow system integrated into the pod loader interface 10 maintains an ultra-clean micro-environment that envelopes the wafer carrier 24. The loading platform 16 is part of a walled moving carriage 80 which supports the loading platform 16 and the air flow system in an integrated moving structure. A front opening 81 in the moving carriage 80 aligns with the opening 13 in the main bulkhead 12 during unloading from and reloading onto the loading platform 16 of wafer carriers 24.

An elevator drive mechanism 22, depicted in FIG. 5, raises and lowers the elevator 14. Before the elevator 14 rises along the main bulkhead 12 to lift the cover 20 off the SMIF pod, clamps 141, controlled by air cylinders 142, secure the pod cover 20 in position on the elevator 14. The elevator drive mechanism 22 includes a motor 221 which turns, via a belt-and-pulley linkage, a lead screw 222. The lead screw 222 is affixed via two mounting blocks 223 to the bulkhead 12. An elevator carriage 224 travels up and down two guide rails 225. The elevator carriage 224 is affixed to the bulkhead 12 by two connecting arms, which slide along slots in the rear of the bulkhead 12.

The articulated arm 18 is the means used to grasp and move the wafer carrier 24 both horizontally and vertically. The arm includes pivoting shoulder 181, elbow 182, and wrist 183 joints to allow a complete range of motion in a horizontal plane. An arm vertical drive 258 raises and lowers the arm 18 together with the wafer carrier 24 vertically. The vertical drive 258 includes a second motor 261 which turns, via a belt-and-pulley linkage, a lead screw 262. The lead screw 262 is affixed to the bulkhead 12 via a mounting block 263. A bearing assembly 264 affixed to an arm carriage 265 drives the arm carriage 265 up and down responsive to rotation of the lead screw 262. The arm carriage 265 travels up and down along two guide rails 266. An upper end of the articulated arm 18 is affixed to the arm carriage 263 so that the arm 18 moves up and down with the carriage 265.

The arm carriage 265 also supports a third motor 267 which provides the impetus for horizontal motion of the articulated arm 18. The third motor 267 also uses a belt-and-pulley linkage to transmit rotational force to the arm 18.

An end effector 28, affixed to an end of the arm 18, grasps and secures the wafer carrier 24. Gripping means 281, included in the end effector 28, are extended and retracted by air cylinders.

The moving carriage 80 includes a plenum chamber 30 that is part of the integrated air flow system. The plenum chamber 30 has a horizontal portion 303 and a vertical portion 304. The vertical portion 304 of the plenum chamber 30 is displaced to one side of the loading platform 16, and is connected to and communicates with the loading platform 16 via an outlet opening 305 in the vertical portion 304 of the plenum chamber 30 facing the bulkhead 12. The bottom horizontal portion 303 of the plenum chamber 30 has a inlet opening 71 that is covered by a clean air filter 70, preferably an ULPA filter. The clean air filter 70 is attached in a sealed relationship to the moving carriage 80. A fan 60, affixed to the clean air filter 70, forces a flow of clean air through the clean air filter 70 into the plenum chamber 30. The fan 60, the clean air filter 70, and the plenum chamber 30 all move as a unit together with the loading platform 16 vertically up and down the main bulkhead 12.

The vertical portion 304 of the plenum chamber 30 is slightly greater in length than the height of the wafer carrier 24 of the SMIF pod. A first of two perforated grills 50, that occludes the vertical portion of 304 of the plenum chamber 30, slopes at an angle with respect to the vertical portion 304. Disposed in this position, the vertical portion 304 of the plenum chamber 30 on a side of the first perforated grill 50 nearest to the inlet opening 71 tapers from a wider cross-section nearest to the inlet opening 71 to a narrower cross-section furthest from the inlet opening 71. A second of the two perforated grills 50 is disposed vertically within the plenum chamber 30 nearer to the loading platform 16 to occlude the outlet opening 305.

Figure 3:
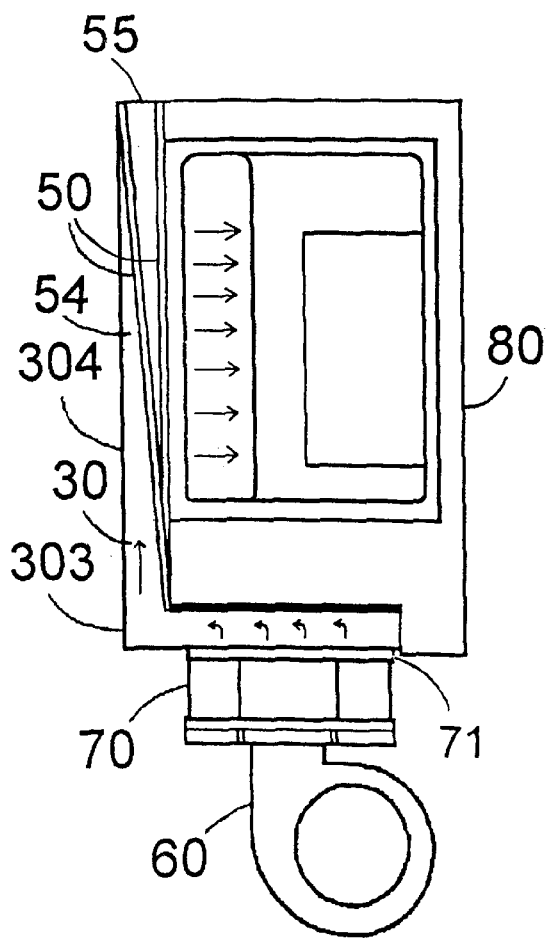
FIG. 3 is a side diagrammatic view of the loading platform carriage of the improved pod loader interface illustrating the grills and the uniform air flow.
Figure 4:
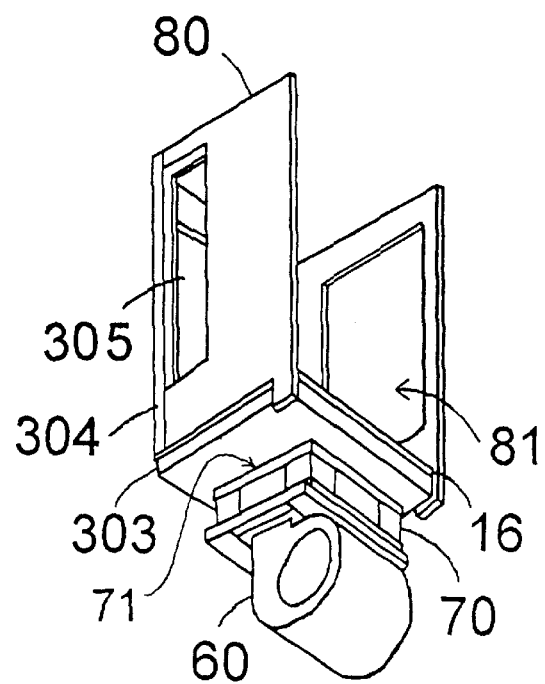
FIG. 4 is a bottom perspective view of the loading platform carriage of the improved pod loader interface.

The outlet opening 305 of the plenum chamber 30 is preferably 9.3 inches wide by 11.5 inches high, and the vertical portion 304 of the plenum chamber 30 has a depth of 0.7 inches directed horizontally away from the bulkhead 12. The perforated grills 50 are preferably made from 0.018 inch thick sheet of non-contaminating stainless steel that is pierced by a rectangular grid of 0.033 inch diameter openings spaced 0.055 inches apart along orthogonal axes that define the grid. In this configuration of the present invention, the first perforated grill 50 is inclined with respect to the vertical portion 304 at an angle of approximately 3°. Thus, as best illustrated in FIG. 3, the first grill 50 establishes a triangular cross-section 54 in the vertical portion 304 of the plenum chamber 30 on the side of the first grill 50 nearest to the inlet opening 71. A triangular cross-section 55 is also established within the plenum chamber 30 between the first and second grills 50.

As best illustrated in FIGS. 1 and 3, the fan 60 forces a stream of clean room air through the filter 70 and into the horizontal portion 303 of the plenum chamber 30 as indicated by horizontal arrows. The ultra-clean air flowing horizontally through the horizontal portion 303 reaches the vertical portion 304 to then rise vertically within the triangular cross-section 54 established by the sloping first grill 50. The ultra-clean air then flows first through the first grill 50, then through the triangular cross-section 55 between the grills 50, and finally past a plurality of wafers present in the exposed wafer carrier 24 resting on the loading platform 16. The combined grills 50 disposed within the vertical portion 304 of the plenum chamber 30 produce a uniform flow of air past the wafer carrier 24 from the bottom to the top of the outlet opening 305. Since the plurality of wafers supported in the wafer carrier 24 have a spaced parallel horizontal arrangement, the integrated air flow system provides a uniform flow of clean air across upper and lower surfaces of the plurality of wafers.

Figure 2:
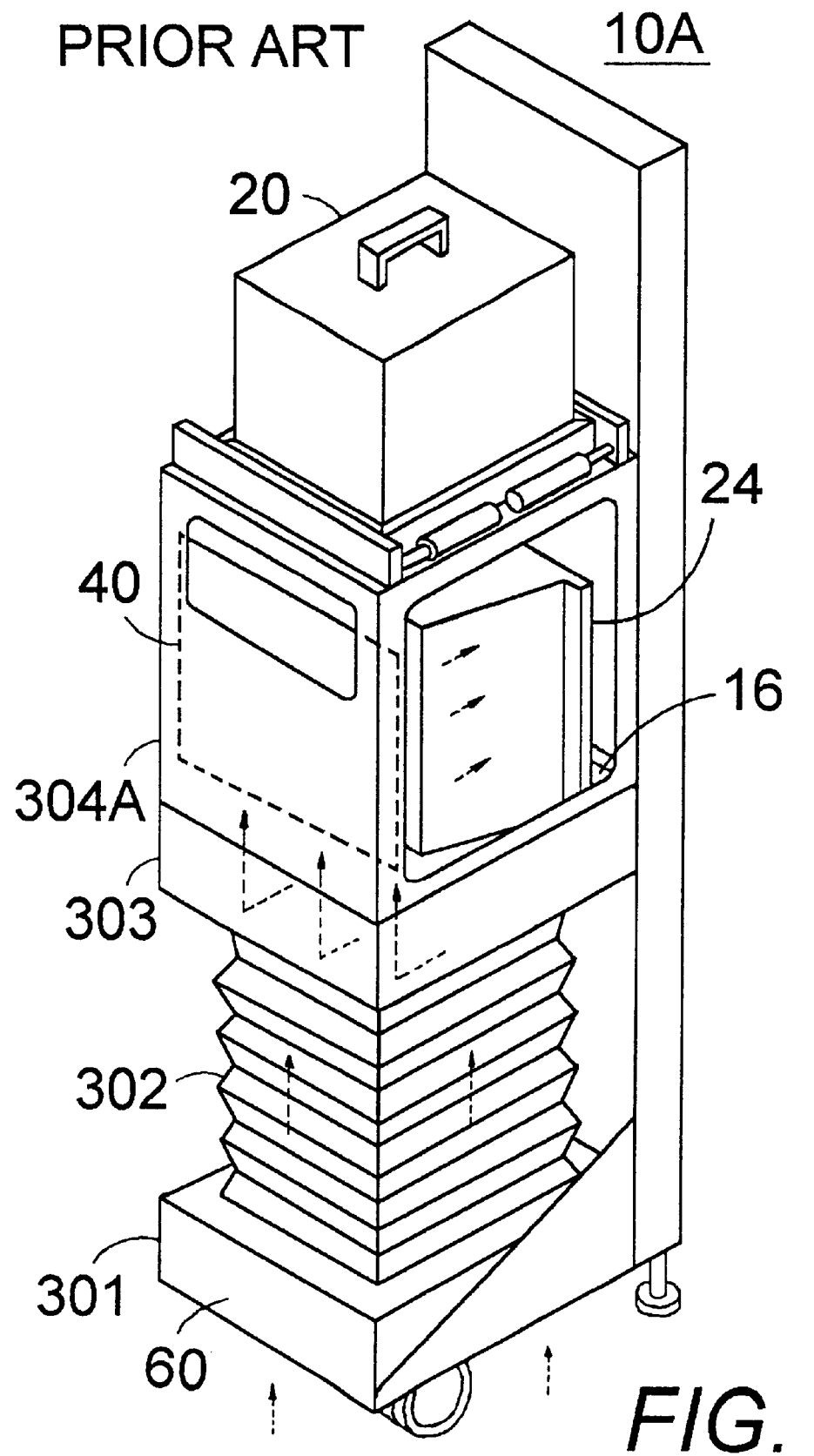
FIG. 2 is a front perspective view of the prior art pod loader interface having a bellows and a vertical membrane in the vertical portion of the plenum chamber.

FIG. 2 depicts a pod loader interface 10A of the prior art in which the vertical portion 304A of the plenum chamber 30 is occluded at the outlet opening 305 by a rectangularly-shaped membrane 40 formed by two sheets of GORTEX fabric. In the prior art pod loader interface of FIG. 2, the fan 60 was located in a base 301 of the pod loader interface 10A, and a flexible bellows 302 supplied air from the fan 60 to the clean air filter 70 secured to the moveable loading platform 16. The present invention eliminates the bellows 302 thereby removing a source of contamination from clean air supplied to the micro-environment that the pod loader interface 10 provides for the wafer carrier 24 present on the loading platform 16.

The integrated air flow system of the present invention employing the perforated grills 50 is capable of producing a uniform horizontal flow of clean air having a velocity of up to 110 feet per minute. Conversely, the prior art system depicted in FIG. 2 could provide only a vertically non-uniform flow ranging from 20 to 70 feet/minute. While the present invention is capable of providing a uniform horizontal flow of clean air at velocities up to 110 feet per minute, in practice it has been found that a uniform velocity of 90 feet/minute adequately maintains the ultra-clean environment for wafers supported within the wafer carrier 24.

In operating the pod loader interface 10, an operator places a SMIF pod on the loading platform 16. The pod loader interface 10 is then activated which causes the pod to be unlocked. The elevator 14 secures the cover 20 and raises to its highest position, as shown in FIG. 1, lifting the cover 20 above the wafer carrier 24. The articulated arm 18 then moves into position over the carrier 24. The gripping means 281 of the end effector 28 are retracted by the air cylinders, thus securing the carrier 24. The arm 18 then lifts the carrier 24 from the loading platform 16, moves it through the front opening 81, and places it into the proper position for the desired process operation. After the manufacturing process operation is completed, the pod loader interface 10 reverses this process to reload the wafer carrier 24 back into the SMIF pod with cover 20 for transportation to the next desired location.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A pod loader interface adapted for unloading and reloading a Standard Mechanical InterFace ("SMIF") pod; the SMIF pod including a wafer carrier adapted to receive a plurality of wafers contained a spaced parallel arrangement, and a pod cover which mates with and seals to a base of the SMIF pod thereby enclosing within the pod cover the wafer carrier and any wafers received therein; the pod loader interface comprising:

a loading platform adapted for receiving the base of the SMIF pod;

a means for removing the pod cover to expose the wafer carrier of the SMIF pod;

a means for transporting the wafer carrier horizontally after the pod cover has been removed; and an integrated air flow system for maintaining an ultra-clean micro-environment that envelopes the wafer carrier when present on the loading platform, the integrated air flow system comprises a plenum chamber connected to and communicating with the loading platform, the plenum chamber having an inlet opening for receiving a flow of clean air, and including a vertical portion having a vertical length that is slightly greater than a height of the wafer carrier, and that is positioned adjacent to the wafer carrier when present on the loading platform; the vertical portion having an outlet opening for admitting a horizontally directed, uniform flow of clean air into the ultra-clean micro-environment enveloping the wafer carrier present on the loading platform, through the wafer carrier, and past wafers present in the wafer carrier.

2. The pod loader interface of claim 1 wherein:

a first sloping grill occludes the plenum chamber, the grill being oriented at an angle so the vertical portion of the plenum chamber on a side of the first grill nearest to the inlet opening tapers from a wider cross-section nearest to the inlet opening to a narrower cross-section furthest from the inlet opening; and a second vertically oriented grill occludes the outlet opening.

3. The pod loader interface of claim 2 wherein the vertical portion of the plenum chamber on the side of the first grill nearest to the inlet opening has a triangular cross-section.

4. The pod loader interface of claim 2 wherein the vertical portion of the plenum chamber between the first and second grills has a triangular cross-section.

5. The pod loader interface of claim 2 wherein the wafer carrier holds a plurality of wafers in a spaced parallel arrangement, and the integrated air flow system produces a uniform flow of clean air across upper and lower surfaces of the plurality of wafers.

6. The pod loader interface of claim 2 wherein the grill is fabricated of a sheet of non-contaminating metal that is perforated by an array of openings which permit passage of air there-through.

7. The pod loader interface of claim 2 wherein the integrated air flow system is capable of producing a uniform flow of clean air having a velocity of approximately 90 feet per minute.

8. The pod loader interface of claim 1 wherein the integrated air flow system is capable of producing a uniform flow of clean air having a velocity of approximately 90 feet per minute.

9. The pod loader interface of claim 1 further comprising:

a clean air filter that covers the inlet opening of the plenum chamber; and a fan affixed to the clean air filter for forcing the flow of clean air through the clean air filter into the plenum chamber.

10. The pod loader interface of claim 9 wherein the loading platform, the plenum chamber, the clean air filter, and the fan are moveable vertically as a unit.

11. The pod loader interface of claim 9 wherein the inlet opening is below the loading platform and the clean air filter is positioned in a spaced parallel alignment with the loading platform below the loading platform to form a horizontal portion of the plenum chamber therebetween in communication with the vertical portion of the plenum chamber, and the fan is positioned below the clean air filter; the clean air filter, the horizontal portion of the plenum chamber, and the fan being configured no larger than the loading platform.

12. The pod loader interface of claim 9 wherein the clean air filter is a ULPA filter.

* * * * *